United States Patent
Huang et al.

(10) Patent No.: US 8,785,247 B2
(45) Date of Patent: Jul. 22, 2014

(54) CHIP PACKAGE AND METHOD FOR FORMING THE SAME

(71) Applicant: Xintec Inc., Jhongli (TW)

(72) Inventors: Yu-Lung Huang, Daxi Township (TW); Yu-Ting Huang, Tainan (TW)

( * ) Notice: Subject to any disclaimer, the term of this patent is extended or adjusted under 35 U.S.C. 154(b) by 0 days.

(21) Appl. No.: 13/893,015

(22) Filed: May 13, 2013

(65) Prior Publication Data
US 2013/0252368 A1    Sep. 26, 2013

Related U.S. Application Data

(62) Division of application No. 13/184,443, filed on Jul. 15, 2011, now Pat. No. 8,508,028.

(60) Provisional application No. 61/365,206, filed on Jul. 16, 2010.

(51) Int. Cl.
*H01L 21/44* (2006.01)
*H01L 21/48* (2006.01)
*H01L 21/50* (2006.01)

(52) U.S. Cl.
USPC ............ 438/110; 438/113; 438/114; 438/125

(58) Field of Classification Search
USPC .................. 438/110, 113, 114, 125
See application file for complete search history.

(56) References Cited

U.S. PATENT DOCUMENTS

| 8,476,738 B2 * | 7/2013 | Liu ............................... 257/622 |
| 8,633,558 B2 * | 1/2014 | Lin et al. ....................... 257/433 |
| 2008/0237828 A1 * | 10/2008 | Yang ............................. 257/690 |
| 2011/0169139 A1 * | 7/2011 | Lin et al. ....................... 257/621 |
| 2011/0278735 A1 * | 11/2011 | Yen et al. ...................... 257/774 |
| 2011/0298000 A1 * | 12/2011 | Liu et al. ......................... 257/99 |
| 2012/0153443 A1 * | 6/2012 | Grinman et al. ............. 257/660 |
| 2013/0177274 A1 * | 7/2013 | Kosenko et al. ................ 385/14 |

* cited by examiner

*Primary Examiner* — Ngan Ngo
(74) *Attorney, Agent, or Firm* — Liu & Liu

(57) ABSTRACT

According to an embodiment, a chip package is provided, which includes: a substrate having a first surface and a second surface; a device region formed in the substrate; a passivation layer formed overlying the first surface of the substrate; at least a polymer planarization layer formed overlying the passivation layer; a package substrate disposed overlying the first surface of the substrate; and a spacer layer disposed between the package substrate and the passivation layer, wherein the spacer layer and the package substrate surround a cavity overlying the substrate, wherein the polymer planar layer does not extends to an outer edge of the spacer layer.

20 Claims, 8 Drawing Sheets

CHIP PACKAGE AND METHOD FOR FORMING THE SAME

CROSS REFERENCE TO RELATED APPLICATIONS

This Application is a Divisional of U.S. application Ser. No. 13/184,443, filed on Jul. 15, 2011, which claims the benefit of U.S. Provisional Application No. 61/365,206, filed on Jul. 16, 2010, the entirety of which are incorporated by reference herein.

BACKGROUND OF THE INVENTION

1. Field of the Invention

The present invention relates to a chip package, and in particular relates to a chip package formed by a wafer-level packaging process.

2. Description of the Related Art

A chip package is used to protect a chip packaged therein and provides conducting routes between the chip and an external electronic element. The present chip package may suffer problems of moisture infiltration and/or bad adhesion, which largely affect the operation of the packaged chip.

Thus, it is desired to improve the reliability of chip packages.

BRIEF SUMMARY OF THE INVENTION

An embodiment of the invention provides a chip package which includes: a substrate having a first surface and a second surface; a device region formed in the substrate; a passivation layer formed on the first surface of the substrate; at least a polymer planarization layer formed on the passivation layer; a package substrate disposed on the first surface of the substrate; and a spacer layer disposed between the package substrate and the passivation layer, wherein the spacer layer and the package substrate surround a cavity on the substrate, wherein the polymer planar layer does not extends to an outer edge of the spacer layer.

An embodiment of the invention provides a method for forming a chip package which includes: providing a substrate having a first surface and a second surface, wherein a plurality of device regions are formed in the substrate, and the device regions are separated from each other by a plurality of predetermined scribe lines; forming a passivation layer on the first surface of the substrate; forming a polymer planar layer on the passivation layer; patterning the polymer planar layer to form a plurality of patterned polymer planar layers, wherein the patterned polymer planar layers are located on a corresponding one of the device regions, respectively; disposing a package substrate on the first surface of the substrate; disposing a spacer layer between the package substrate and the passivation layer, wherein the spacer layer and the package substrate surround a plurality of cavities on the substrate, and each of the patterned polymer planar layers does not extends to any one of the predetermined scribe lines, respectively; and dicing the substrate and the package substrate along the predetermined scribe lines to form a plurality of separate chip packages.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
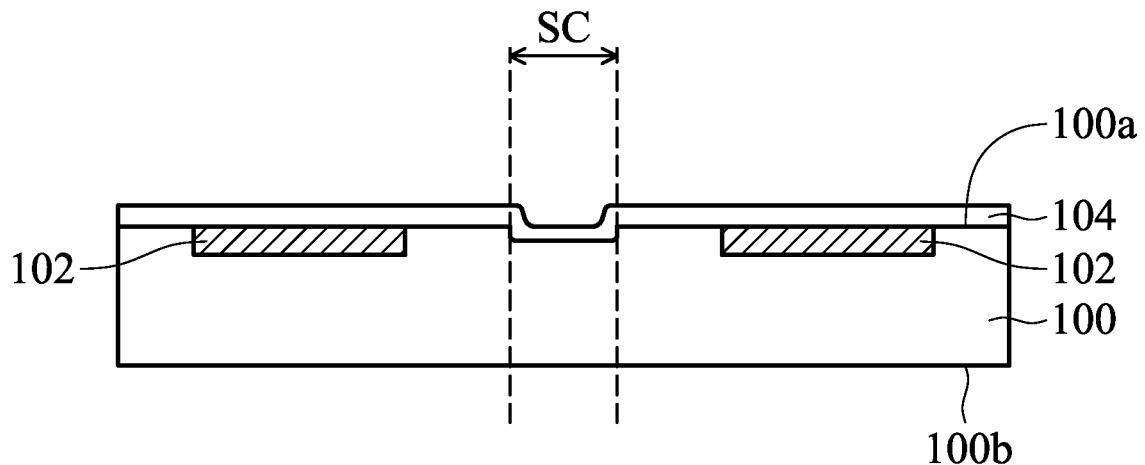
FIGS. 1A-1E are cross-sectional views showing the steps of forming a chip package according to an embodiment of the present invention.

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for using the embodiments of the invention are illustrated in detail as followed. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a light sensor chip. However, embodiments of the invention are not limited thereto. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits.

Before embodiments of the invention are illustrated, a chip package known by the inventor is illustrated with reference made to FIG. 3. However, it should be appreciated that the chip package shown in FIG. 3 is not a conventional structure known by one skilled in the art, and it is merely used to illustrate problems found by the inventor.

Figure 3:
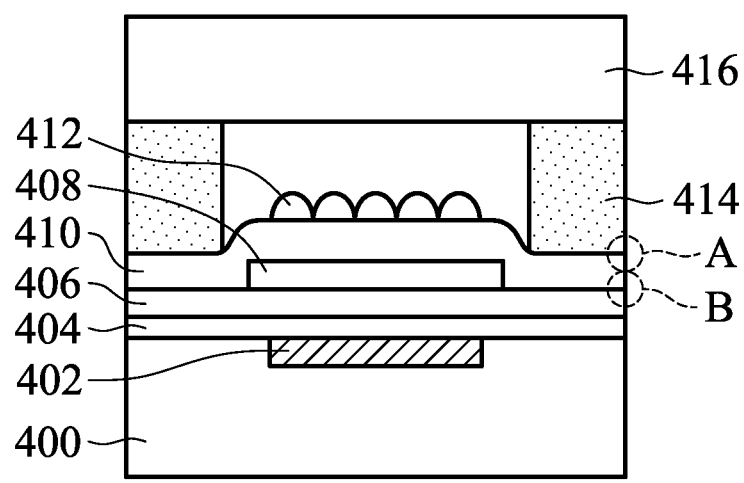
FIG. 3 is a cross-sectional view showing a chip package known by the inventor of the invention.

As shown in FIG. 3, the chip package includes a substrate 400, wherein a device region 402 is formed therein. A passivation layer 404, a planar layer 406, a light filter layer 408, a planar layer 410, and a lens 412 are formed in sequence on the substrate 400 and the device region. Further, the package substrate 416 is disposed on the substrate 400 through a spacer layer 414.

However, the inventor of the invention has found, that the chip package as shown in FIG. 3 has some reliability problems. For example, adhesion between the spacer layer 414 and the planar layer 410 is not sufficient enough, such that it is easy for moisture to enter the chip package through the interface (such as the location A) between the spacer layer 414 and the planar layer 410. In addition, it is also easy for moisture to enter the chip package through the interface (such as the location B) between the planar layer 410 and the planar layer 406. Once moisture enters the chip package, operation of the chip package is affected.

In order to resolve or reduce the degree of the problems mentioned above, a chip package and the fabrication method thereof according to an embodiment of the invention are provided and illustrated with references made to the drawings.

Figure 4:
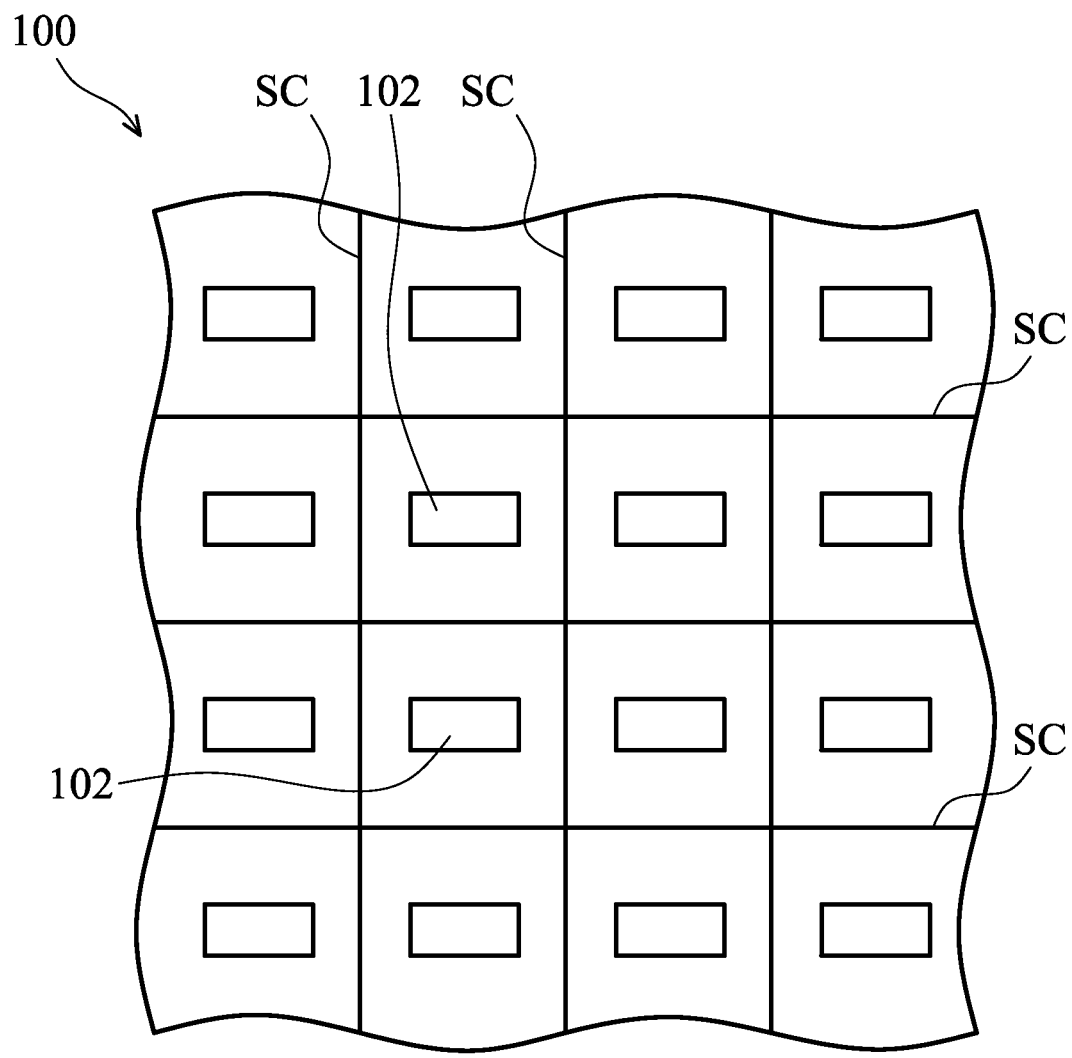
FIG. 4 is a top view correspondingly showing the embodiment shown in FIG. 1A.

FIGS. 1A-1E are cross-sectional views showing the steps of forming a chip package according to an embodiment of the present invention. As shown in FIG. 1A, a substrate 100 is provided, which has a surface 100a and a surface 100b. The substrate 100 is, for example, a semiconductor substrate such as a silicon substrate or another suitable semiconductor substrate. In one embodiment, the substrate 100 may be a semiconductor wafer (such as a silicon wafer), wherein a wafer-level packaging process may be performed thereto. In the embodiment shown in FIG. 1A, a plurality of device regions 102 are formed in the substrate 100, and the device regions 102 are separated from each other by a plurality of predetermined scribe lines SC. Usually, the predetermined scribe line SC includes a trench extending from the surface 100a towards the surface 100b. FIG. 4 is a top view correspondingly showing the embodiment shown in FIG. 1A. As shown in FIG. 4, the plurality of scribe lines SC divide the substrate 100 into a plurality of regions. These regions respectively have a device region 102 formed therein.

The device region 102 may include a variety of electronic devices. For example, in one embodiment, the device region 102 may include active or passive devices, or electronic components with digital or analog circuits, such as opto electronic devices, micro electro mechanical systems (MEMS), micro fluidic systems, and physical sensors for detecting heat, light, or pressure. The device region 102 includes, for example, image sensor devices, light-emitting diodes, solar cells, RF circuits, accelerators, gyroscopes, micro actuators, surface acoustic wave devices, pressure sensors, ink printer heads or power modules. In the following description, an embodiment with a device region 102 including an image sensor device is taken as an example.

Referring to FIG. 1A, a passivation layer 104 may be formed on the surface 100a of the substrate 100, wherein the material of the passivation layer may be (but is not limited to) silicon oxide, silicon nitride, the like thereof, or combinations thereof.

Figure 1B:
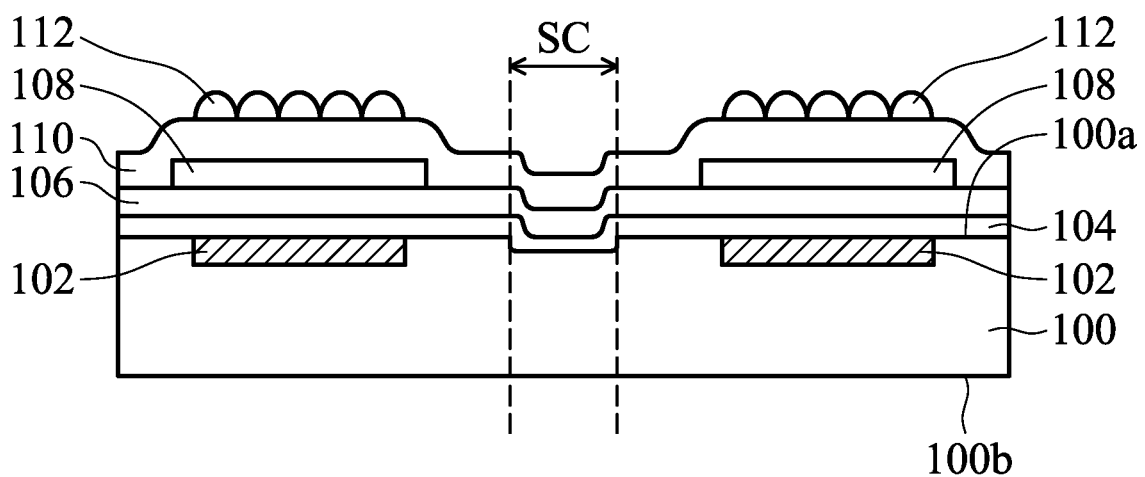

Next, as shown in FIG. 1B, a planar layer 106 is formed on the passivation layer 104. The planar layer 106 may be, for example, a polymer planar layer. Then, an optical element may be optionally disposed on the device region 102. For example, in the embodiment shown in FIG. 1B, an optical element is formed directly on each of the device regions 102. For example, in the embodiment shown in FIG. 1B, the optical element is a light filter layer 108 which may be a color filter layer. Then, a planar layer 110 may be formed on the light filter layer 108. Another optical element, such as a lens 112, may be optionally disposed on the planar layer 110 at a location correspondingly and substantially directly on the device region 102. Usually, the lens 112 may be a microlens array. Note that, as shown in FIG. 1B, the polymer planar layers (such as the planar layers 106 and 110) extend onto the predetermined scribe lines SC.

Figure 1C:
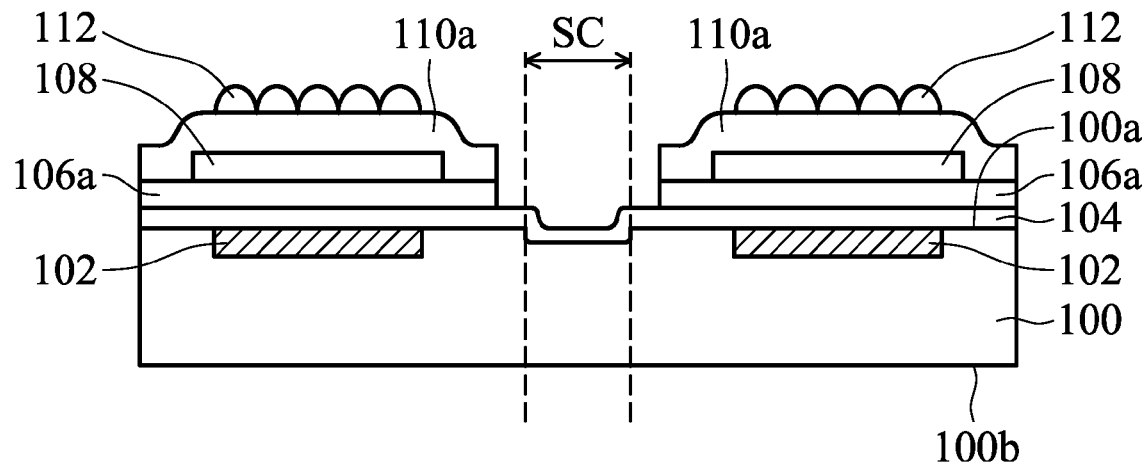

As shown in FIG. 1C, the polymer planar layers may then be patterned into a plurality of patterned polymer planar layers. For example, the polymer planar layers 110 and 106 may be patterned into a plurality of patterned polymer planar layers 110a and 106a by a patterning process, respectively. The patterned polymer planar layers are located on corresponding device regions 102, respectively. In one embodiment, the patterning of the polymer planar layers 110 and 106 includes substantially and completely removing the portions of the polymer planar layers covering the predetermined scribe lines SC. Thus, when the substrate 100 and a package substrate 116 (see FIGS. 1D-1E) are subsequently diced along the predetermined scribe lines, the patterned polymer planar layers 110a and 106a are not diced.

Figure 1D:
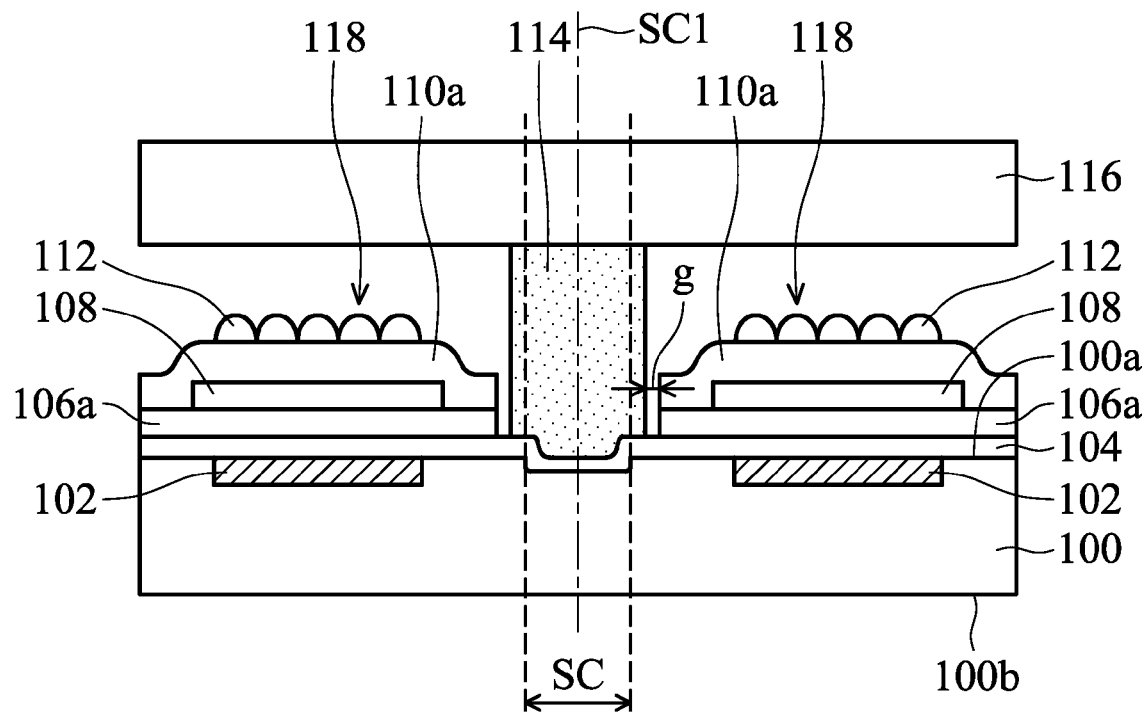

Next, as shown in FIG. 1D, the package substrate 116 is disposed on the surface 100a of the substrate 100. For example, the package substrate 116 may be fixed on the surface 100a of the substrate 100 through a spacer layer 114 preformed on the package substrate 116 or preformed on the surface 100a of the substrate 100. The spacer layer 114 usually covers a portion of the predetermined scribe line SC. In one embodiment, the package substrate 116 is a transparent substrate, wherein light may easily enter the package to reach the device region. Alternatively, in another embodiment, the device region 102 includes a light emitting device. If a transparent substrate is used as the package substrate 116, light generated by the light emitting device may easily emit to the outside of the package. A suitable transparent substrate includes, for example, (but is not limited to) a glass substrate, quartz substrate, or transparent polymer substrate.

Note that, in one embodiment, the spacer layer 114 may directly contact with and bond to the passivation layer 104. For example, the spacer layer 114 may include a silicone-based polymer and an insulating inorganic material. The spacer layer 114 may be softened when being heated and be cured when the temperature is further elevated. For example, in one embodiment, the spacer layer 114 is preformed on the package substrate 116 and disposed on the passivation layer 104. Then, the spacer layer 114 is softened by heating, and then the spacer layer 114 is cured when the temperature is elevated. Thus, the spacer layer 114 directly contacts with the passivation layer 104 and bonds with the passivation layer 104. In this case, the spacer layer 114 may directly contact with and bond with the passivation layer 104 on the substrate 100, and an adhesion layer is not needed. Further, in the embodiment shown in FIG. 1D, the spacer layer 114 is separated from the patterned polymer planar layers 110a and 106a by a distance g and does not directly contact with the patterned polymer planar layers 110a and 106a.

The spacer layer 114 and the package substrate 116 may surround a substantially closed cavity 118 on the substrate 100. A corresponding device region 102 is located below each of the cavities 118. In addition, each of the patterned polymer planar layers 110a and patterned polymer planar layers 106a are completely located in a corresponding cavity 118, respectively.

Figure 1E:
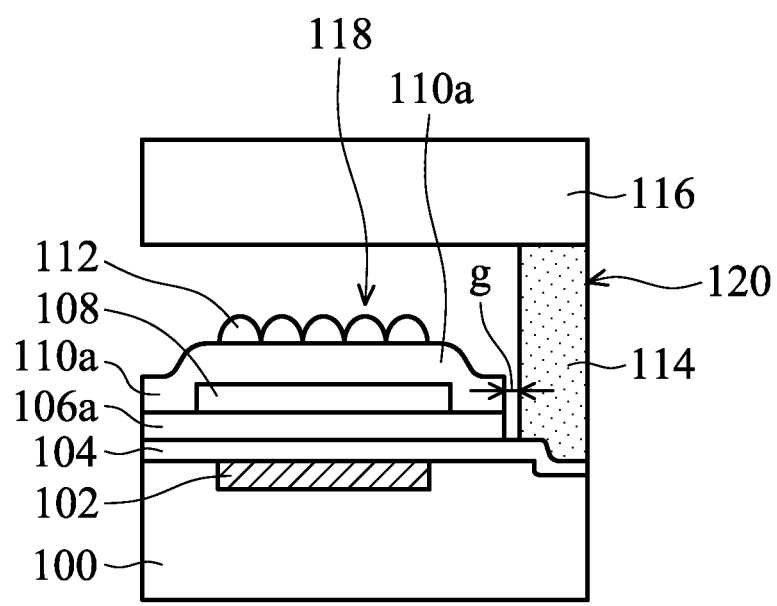

As shown in FIG. 1E, the substrate 100 and the package substrate 116 may then be diced along the predetermined scribe lines SC to form a plurality of separate chip packages, wherein the actual scribe lines are denoted as SC1 (see FIG. 1D). As mentioned above, after being patterned, the patterned polymer planar layers 110a and 106a are completely located in the cavity 118 without contacting with the actual scribe lines denoted as SC1. During the dicing process, the patterned polymer planar layer is not diced. Thus, as shown in FIG. 1E, an outer sidewall 120 of the formed chip package includes the package substrate 116, the spacer layer 114, the passivation layer 104, and the substrate 100. In this embodiment, the outer sidewall 120 of the chip package does not include the patterned polymer planar layer 110a or 106a. Because the outer sidewall 120 of the chip package does not include the patterned polymer planar layer 110a or 106a, the outer sidewall 120 therefore has no interface between the polymer planar layer and the spacer layer (wherein, adhesion between the polymer planar layer and the spacer layer is relatively bad), thus moisture is prevented from entering the package. The operation and the reliability of the chip package are therefore improved.

Embodiments of the invention are not limited to the embodiments mentioned above and may be varied. For example, FIGS. 2A-2B are cross-sectional views showing the steps of forming a chip package according to another embodiment of the present invention, wherein same or similar reference numbers are used to designate same or similar elements.

Figure 2A:
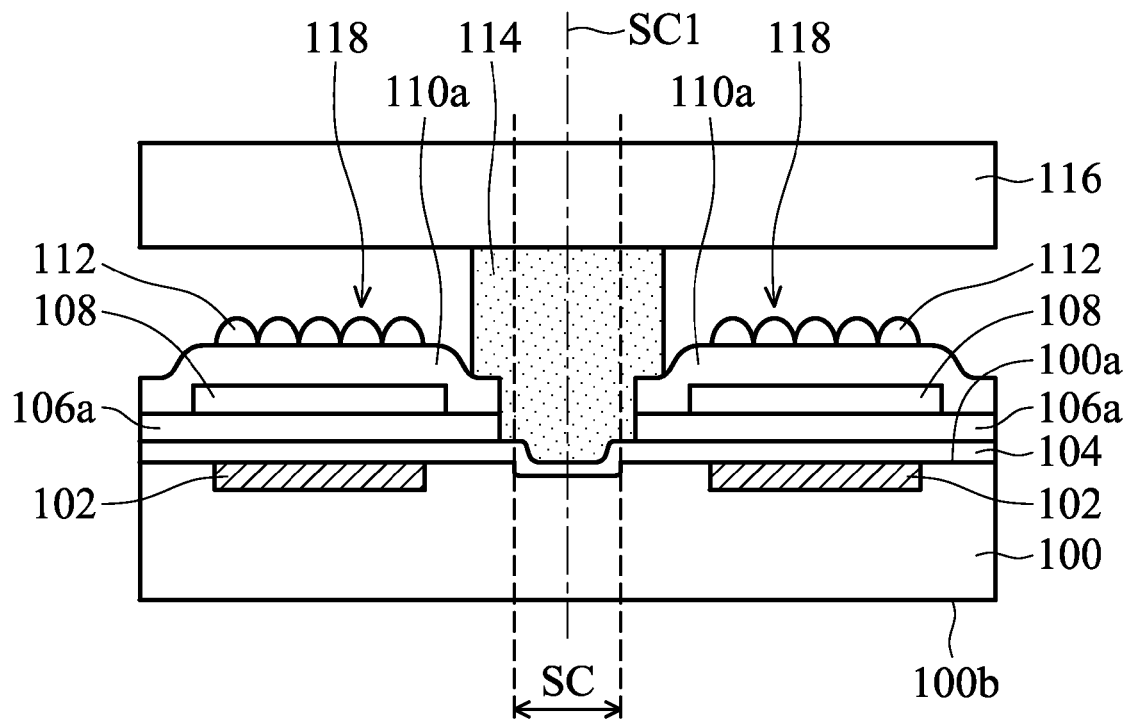
FIGS. 2A-2B are cross-sectional views showing the steps of forming a chip package according to an embodiment of the present invention.

Referring to FIG. 2A, the structure is formed by a method similar to that illustrated in FIGS. 1A-1D, wherein the main difference is that the patterned polymer planar layers 110a and 106a in the cavity 118 directly contact with a portion of the spacer layer 114. In one embodiment, the spacer layer 114 further covers a portion of the polymer planar layer 110a. However, it should be noted that a contact region between the spacer layer 114 and the polymer planar layer 110a is not too large to affect the reliability of the chip package.

Figure 2B:
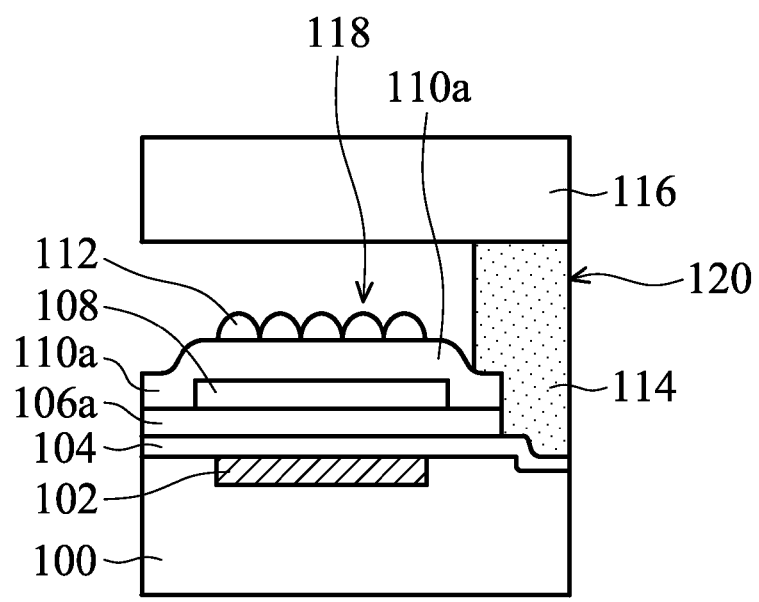

As shown in FIG. 2B, after the substrate 100, the package substrate 116, and the spacer layer 114 are diced along the predetermined scribe lines SC (wherein the actual scribe line is denoted as SC1), the outer sidewall 120 of the obtained chip package also does not include the patterned polymer planar layers 110a and 106a. Thus, the outer sidewall 120 of the chip package does not have the interface between the spacer layer and the polymer planar layer and moisture may be prevented from entering the package. Thus, the embodiment shown in FIG. 2B also has improved reliability.

Figure 5A:
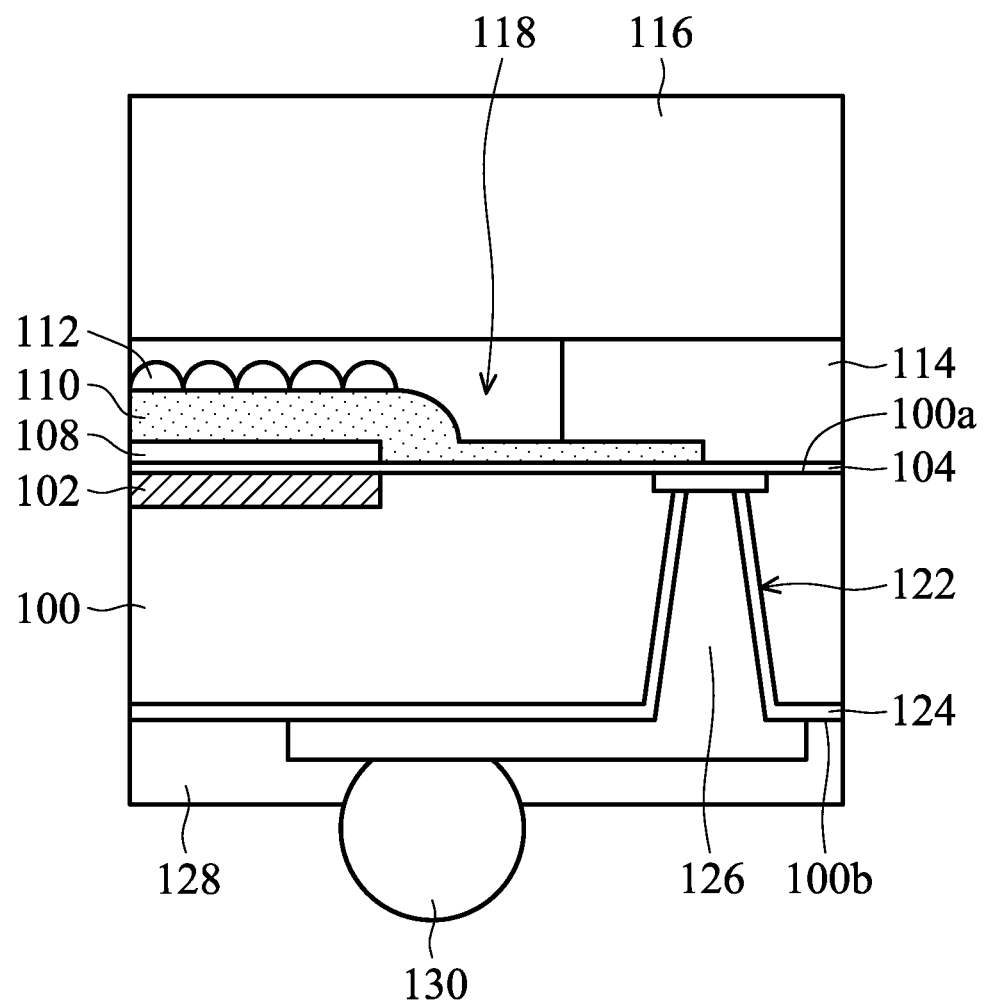
FIGS. 5A and 5B are cross-sectional views respectively showing chip packages according to embodiments of the present invention.
Figure 5B:
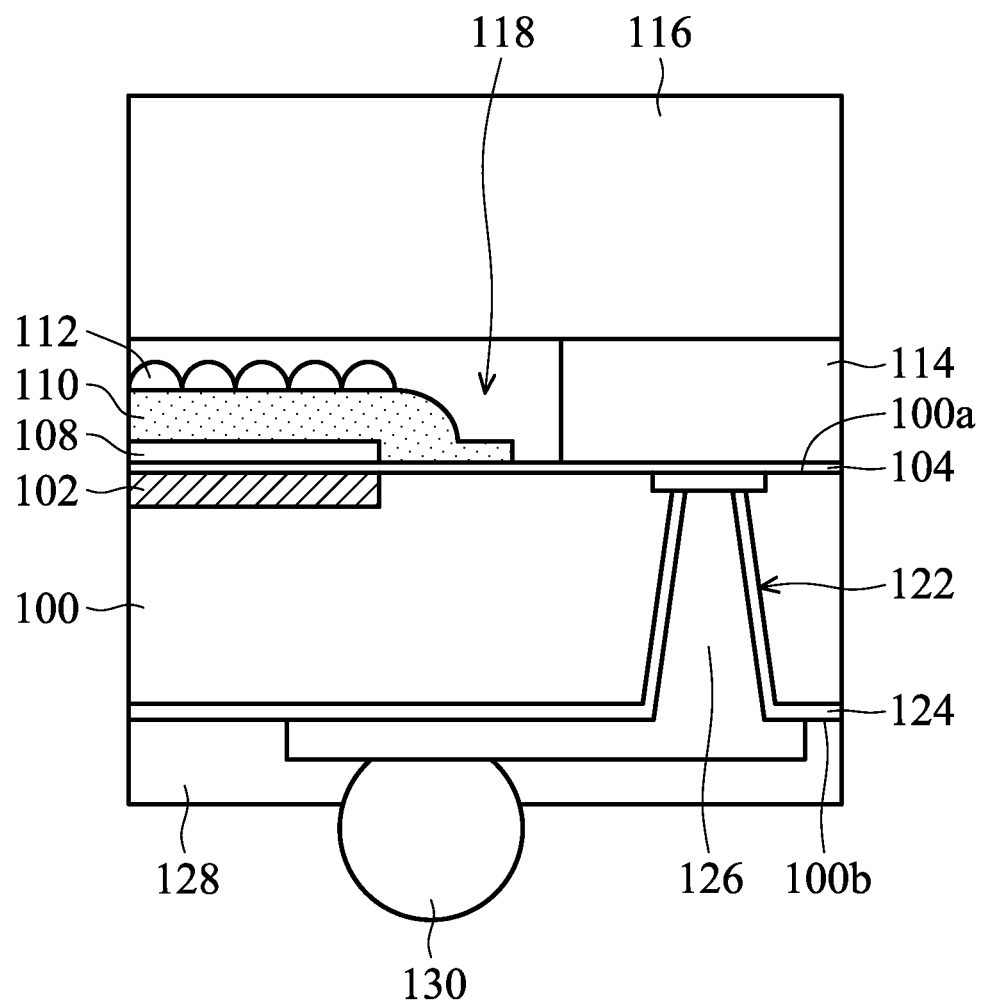

FIGS. 5A and 5B are cross-sectional views respectively showing chip packages according to embodiments of the present invention, wherein same or similar reference numbers are used to designate same or similar elements.

The embodiment shown in FIG. 5A is similar to the embodiment shown in FIG. 1E. The main difference is that the chip package shown in FIG. 5A includes a through substrate conducting structure, and the disposition of the polymer planar layer 110 is not completely the same as that shown in FIG. 1E and the through substrate conducting structure is formed by a method illustrated below. For example, the substrate 100 may be optionally thinned from the surface 100b of the substrate 100. Then, a portion of the substrate 100 is removed to form a through-hole 122 extending towards the surface 100a. Then, an insulating layer 124 is formed on a sidewall of the through-hole 122, which may extend onto the surface 100b. Then, a conducting layer 126 may be formed on the insulating layer 124 on the sidewall of the through-hole 122, which may extend onto the surface 100b of the substrate 100. The conducting layer 126 may substantially and completely fill the through-hole 122 or may substantially and conformally be formed on the sidewall of the through-hole 122. The conducting layer 126 may be electrically connected to the device region 102 through a pad under the through-hole 122. Then, a solder mask layer 128 may be formed on the surface 100b of the substrate 100 and the conducting layer 126. The solder mask layer may be optionally patterned such that a portion of the conducting layer 126 is exposed, and a conducting structure 130, such as a solder ball or a conducting bump, may be formed thereon.

In the embodiment shown in FIG. 5A, although the spacer layer 114 covers and directly contacts with a portion of the polymer planar layer 110, the contact region is not too large to affect the reliability of the chip package. The outer sidewall of the chip package shown in FIG. 5A does not include the interface between the spacer layer 114 and the polymer planar layer 110. Thus, moisture is prevented from entering the package. The operation and the reliability of the chip package is improved.

The embodiment shown in FIG. 5B is similar to the embodiment shown in FIG. 5A. The main difference is that the spacer layer 114 of the chip package shown in FIG. 5B does not directly contact with the polymer planar layer 110 and is separated from each other by a distance. Similarly, the outer sidewall of the chip package shown in FIG. 5B does not include the interface between the spacer layer 114 and the polymer planar layer 110. Thus, moisture is prevented from entering the package. The operation and the reliability of the chip package is improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a chip package, comprising:
providing a substrate having a first surface and a second surface, wherein a plurality of device regions are formed in the substrate, and the device regions are separated from each other by a plurality of predetermined scribe lines;
forming a passivation layer on the first surface of the substrate;
forming a polymer planar layer on the passivation layer;
patterning the polymer planar layer to form a plurality of patterned polymer planar layers, wherein the patterned polymer planar layers are located on a corresponding one of the device regions, respectively;
disposing a package substrate on the first surface of the substrate;
disposing a spacer layer between the package substrate and the passivation layer, wherein the spacer layer and the package substrate surround a plurality of cavities on the substrate, and each of the patterned polymer planar layers does not extends to any one of the predetermined scribe lines, respectively; and
dicing the substrate and the package substrate along the predetermined scribe lines to form a plurality of separate chip packages.

2. The method for forming a chip package as claimed in claim 1, wherein the spacer layer comprises an inner portion and an outer portion, and the outer portion of the spacer layer directly contacts or covers a portion of the passivation layer.

3. The method for forming a chip package as claimed in claim 1, wherein the step of patterning the polymer planar layer comprises substantially and completely removing a portion of the polymer planar layer covering the predetermined scribe lines.

4. The method for forming a chip package as claimed in claim 1, wherein the step of dicing the substrate and the package substrate along the predetermined scribe lines comprises dicing the spacer layer.

5. The method for forming a chip package as claimed in claim 1, wherein the step of dicing the substrate and the package substrate along the predetermined scribe lines does not comprise dicing the patterned polymer planar layers.

6. The method for forming a chip package as claimed in claim 1, wherein during the step of disposing the spacer layer, the spacer layer does not directly contact with the patterned polymer planar layers.

7. The method for forming a chip package as claimed in claim 1, wherein during the step of disposing the spacer layer, the spacer layer directly contacts with the patterned polymer planar layers.

8. The method for forming a chip package as claimed in claim 1, wherein each of the patterned polymer planar layers is completely located in a corresponding one of the cavities.

9. The method for forming a chip package as claimed in claim 1, further comprising thinning the substrate from the second surface of the substrate.

10. The method for forming a chip package as claimed in claim 9, further comprising:
    after the substrate is thinned, removing a portion of the substrate to form a through-hole extending towards the first surface;
    forming an insulating layer on a sidewall of the through-hole, wherein the insulating layer extends onto the second surface; and
    forming a conducting layer on the insulating layer.

11. The method for forming a chip package as claimed in claim 10, further comprising:
    forming a patterned solder mask layer on the conducting layer such that a portion of the conducting layer is exposed; and
    forming a conducting structure on the exposed conducting layer.

12. The method for forming a chip package as claimed in claim 10, wherein one of the patterned polymer planar layers covers a portion of the through-hole.

13. The method for forming a chip package as claimed in claim 10, wherein none of the patterned polymer planar layers covers a portion of the through-hole.

14. The method for forming a chip package as claimed in claim 1, wherein the spacer layer comprises an inner portion and an outer portion, and the outer portion of the spacer layer is thicker than the inner portion of the spacer layer.

15. The method for forming a chip package as claimed in claim 1, further comprising disposing at least an optical element in each of the cavities and on each of the device regions.

16. The method for forming a chip package as claimed in claim 15, wherein the optical element comprises a light filter layer, a lens, or combinations thereof.

17. The method for forming a chip package as claimed in claim 1, wherein the package substrate comprises a transparent substrate.

18. The method for forming a chip package as claimed in claim 1, wherein an outer sidewall of one of the separate chip packages comprises the diced package substrate, the spacer layer, the passivation layer, and the substrate.

19. The method for forming a chip package as claimed in claim 18, wherein the outer sidewall of one of the separate chip packages does not comprise the patterned polymer planar layers.

20. The method for forming a chip package as claimed in claim 1, wherein the device regions comprise image sensor devices.

* * * * *